United States Patent
Nilsson et al.

(10) Patent No.: US 10,593,540 B2
(45) Date of Patent: Mar. 17, 2020

(54) PVDF-TRFE CO-POLYMER HAVING IMPROVED FERROELECTRIC PROPERTIES, METHODS OF MAKING A PVDF-TRFE CO-POLYMER HAVING IMPROVED FERROELECTRIC PROPERTIES AND METHODS OF CHANGING THE END GROUP OF A PVDF-TRFE CO-POLYMER

(71) Applicants: Jakob Nilsson, Linkoping (SE); Christian Brox-Nilsen, Linkoping (SE)

(72) Inventors: Jakob Nilsson, Linkoping (SE); Christian Brox-Nilsen, Linkoping (SE)

( * ) Notice: Subject to any disclaimer, the term of this patent is extended or adjusted under 35 U.S.C. 154(b) by 0 days.

(21) Appl. No.: 16/249,107

(22) Filed: Jan. 16, 2019

(65) Prior Publication Data

US 2019/0148126 A1  May 16, 2019

Related U.S. Application Data

(62) Division of application No. 15/644,652, filed on Jul. 7, 2017, now Pat. No. 10,224,199, which is a division of application No. 15/229,049, filed on Aug. 4, 2016, now Pat. No. 9,735,004.

(60) Provisional application No. 62/201,366, filed on Aug. 5, 2015.

(51) Int. Cl.
  *C08F 214/22* (2006.01)
  *C08F 8/00* (2006.01)
  (Continued)

(52) U.S. Cl.
  CPC ............ *H01L 21/0212* (2013.01); *C08F 8/00* (2013.01); *C08F 8/04* (2013.01); *C08F 8/12* (2013.01);
  (Continued)

(58) Field of Classification Search
  CPC . H01L 21/0212; H01L 41/193; H01L 37/025; H01L 27/1159; H01L 27/11507;
  (Continued)

(56) References Cited

U.S. PATENT DOCUMENTS

| 4,158,678 A | 6/1979 | Tatemoto et al. |
| 5,037,921 A | 8/1991 | Carlson |

(Continued)

FOREIGN PATENT DOCUMENTS

JP  5-320224 A  12/1993

OTHER PUBLICATIONS

P. Pladis et al.; "Modelling of Vinylidene Fluoride Emulsion Polymerization"; European Symposium on Computer Aided Process Engineering; 2005; 6 pgs.; Elsevier Science B.V.

(Continued)

*Primary Examiner* — William K Cheung
(74) *Attorney, Agent, or Firm* — Andrew D. Fortney; Central California IP Group, P.C.

(57) ABSTRACT

A method of exchanging or transforming end groups in and/or improving the ferroelectric properties of a PVDF-TrFE co-polymer is disclosed. A bulky or chemically dissimilar end group, such as an iodine, sulfate, aldehyde or carboxylic acid end group, may be transformed to a hydrogen, fluorine or chlorine atom. A method of making a PVDF-TrFE co-polymer is disclosed, including polymerizing a mixture of VDF and TrFE using an initiator, and transforming a bulky or chemically dissimilar end group to a hydrogen, fluorine or chlorine atom. A PVDF-TrFE co-polymer or other fluorinated alkene polymer is also disclosed. The co-polymer may be used as a ferroelectric, electromechanical, piezoelectric or dielectric material in an electronic device.

20 Claims, 3 Drawing Sheets

(51) Int. Cl.

| | |
|---|---|
| *C08F 8/04* | (2006.01) |
| *C08F 8/12* | (2006.01) |
| *C08F 8/20* | (2006.01) |
| *C08F 8/26* | (2006.01) |
| *H01L 41/193* | (2006.01) |
| *H01L 21/02* | (2006.01) |
| *C08F 214/18* | (2006.01) |
| *H01L 49/02* | (2006.01) |
| *H01L 37/02* | (2006.01) |
| *H01L 27/11507* | (2017.01) |
| *H01L 27/1159* | (2017.01) |

(52) U.S. Cl.
CPC .................. *C08F 8/20* (2013.01); *C08F 8/26* (2013.01); *C08F 214/182* (2013.01); *C08F 214/22* (2013.01); *H01L 27/1159* (2013.01); *H01L 27/11507* (2013.01); *H01L 28/00* (2013.01); *H01L 37/025* (2013.01); *H01L 41/193* (2013.01); *C08F 2500/02* (2013.01); *C08F 2810/40* (2013.01)

(58) Field of Classification Search
CPC ...... C08F 8/00; C08F 8/04; C08F 8/12; C08F 8/20; C08F 8/26; C08F 214/22; C08F 214/182
USPC ........................................................ 525/199
See application file for complete search history.

(56) References Cited

U.S. PATENT DOCUMENTS

| | | | |
|---|---|---|---|
| 5,585,449 A | 12/1996 | Arcella et al. | |
| 6,355,749 B1 | 3/2002 | Chung et al. | |
| 6,734,478 B2 * | 5/2004 | Johansson | B82Y 10/00 |
| | | | 257/295 |
| 6,809,166 B2 | 10/2004 | Apostolo et al. | |
| 6,828,388 B2 | 12/2004 | Tortelli et al. | |
| 8,637,608 B2 | 1/2014 | Hintzer et al. | |
| 8,785,580 B2 | 7/2014 | Amin-Sanayei | |
| 2003/0056078 A1 | 3/2003 | Johansson et al. | |

OTHER PUBLICATIONS

Philip E. Rakita; "Introducing Fluorine Into Organic Compounds"; Speciality Chemicals Magazine; Jun. 2003; pp. 26-29.

B. Ameduri; "From Vinylidene Fluoride (VDF) to the Applications of VDF-Containing Polymers and Copolymers: Recent Developments and Future Trends"; Chemical Reviews, American Chemical Society; 2009; pp. 6632-6686; 217 pgs.

"Solef PVDF Design & Processing Guide"; Solvay Specialty Polymers; 2015; 64 pgs.; Version 2.3; www.solvay.com.

International Search Report and Written Opinion dated Apr. 10, 2017; International Application No. PCT/IB2016/001258; 17 pages; European Patent Office.

Communication Relating to the Results of the Partial International Search; PCT International Searching Authority dated Feb. 6, 2017; International Application No. PCT/IB2016/001258; 3 pages; International Searching Authority/European Patent Office.

Yogesh Patil et al.; "Novel Method to Assess the Molecular Weights of Fluoropolymers by Radical Copolymerization of Vinylidene Fluoride with Various Fluorinated Comonomers Initiated by a Persistent Radical"; 15 pages; Macromolecules, vol. 46, No. 8; Apr. 5, 2013; ACS Publications.

Georgi Kostov et al.; "Synthesis and Characterizations of Photo-Cross-Linkable Telechelic Diacrylate Poly(vinylidene fluoride-co-perfluoromethyl vinyl ether) Copolymers"; 13 pages; Macromolecules, vol. 45, No. 18; Sep. 4, 2012; ACS Publications.

Nobuhiko Tsuda et al.; "Stabilization of Iodine-Containing Fluorocarbon Polymers"; Chemical Abstracts, No. 11; May 30, 1994; Chemical Abstracts Service (CAS), US.

* cited by examiner

PVDF-TRFE CO-POLYMER HAVING IMPROVED FERROELECTRIC PROPERTIES, METHODS OF MAKING A PVDF-TRFE CO-POLYMER HAVING IMPROVED FERROELECTRIC PROPERTIES AND METHODS OF CHANGING THE END GROUP OF A PVDF-TRFE CO-POLYMER

CROSS REFERENCE TO RELATED APPLICATIONS

This application is a divisional of U.S. application Ser. No. 15/644,652, filed Jul. 7, 2017, now issued as U.S. Pat. No. 10,224,199, which is a divisional of U.S. application Ser. No. 15/229,049, filed Aug. 4, 2016, now issued as U.S. Pat. No. 9,735,004, which claims the benefit of U.S. Provisional Patent Application No. 62/201,366, filed on Aug. 5, 2015, which is incorporated herein by reference as if fully set forth herein.

FIELD OF THE INVENTION

The present invention generally relates to the field(s) of polymers and printed memory. More specifically, embodiments of the present invention pertain to a PVDF-TrFE co-polymer, methods of making a PVDF-TrFE co-polymer, and a method of changing the end group of a PVDF-TrFE co-polymer, especially to a low molecular weight PVDF-TrFE co-polymer with ferroelectric properties and/or performance that are comparable to those of a high molecular weight polymer, and to methods of preparing a low molecular weight PVDF-TrFE co-polymer with attendant advantages.

DISCUSSION OF THE BACKGROUND

Printed memory technology using polyvinylidene fluoride-trifluoroethylene (PVDF-TrFE) as a ferroelectric material is well known. Many reports describe ferroelectric properties for different compositions of PVDF-TrFE co-polymers, more specifically the ratio between VDF (vinylidene fluoride) and TrFE (trifluoroethylene). But the importance of the molecular weight is often neglected.

Experimental data has shown that electrical properties in memory devices that include PVDF-TrFE are improved when the molecular weight of the PVDF-TrFE is increased. For instance, the memories may be switched using a lower electric field.

The draw-back with high molecular weight polymers is that they are more challenging to synthesize and process. A very high molecular weight polymer is, for example, less soluble than a lower molecular weight polymer of the same chemical structure, and a solution of the high molecular weight polymer has a higher viscosity than that of a lower molecular weight polymer of the same chemical structure in the same solvent, which could be a disadvantage during purification (e.g., filtration) and coating. Therefore, there is a commercial interest in a PVDF-TrFE co-polymer with a lower molecular weight that exhibits ferroelectric properties similar to a high molecular weight PVDF-TrFE co-polymer.

One example of post-polymerization end group exchange is the treatment of a carboxyl-terminated PVDF-TrFE co-polymer (e.g., U.S. Pat. Nos. 6,809,166 and 6,828,388, assigned to Solvay Solexis S.p.A.) using $F^2$ and UV light. This reaction exchanges the carboxyl functionality to a fluorine atom. This reaction may not be suitable for polymers other than substantially perfluorinated polymers and copolymers due to the extremely high reactivity of the fluorine gas.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

The present invention relates to an improved ferroelectric polymer and methods of making the same that alleviate the above-mentioned drawbacks. Furthermore, it is an object to provide a method of improving the ferroelectric properties of low molecular weight PVDF-TrFE co-polymers.

In at least one aspect of the present invention, the ferroelectric properties of PVDF-TrFE co-polymers may be improved by selecting or exchanging the end functionalities (or terminal substituents or groups) of the polymer. The molecular weight of the PVDF-TrFE co-polymer may therefore be lowered without adversely affecting the ferroelectric properties of the PVDF-TrFE co-polymer, such as the degree or extent of crystallization and the drive voltage of a memory cell including the PVDF-TrFE co-polymer.

Thus, the present invention relates at least in part to a PVDF-TrFE co-polymer comprising a plurality of vinylidene fluoride units, a plurality of trifluoroethylene units, and end groups or substituents selected from H, F and Cl. The PVDF-TrFE co-polymer may have a molecular weight of from 100 kDa to 800 kDa. For example, the PVDF-TrFE co-polymer may have a formula $X^1-(C_2H_2F_2)_p-(C_2HF_3)_q-X^2$, where $X^1$ is R, H, F or Cl, R is a $C_n$-alkyl group that may contain from 1 to 2n+1 fluorine atoms, $X^2$ is independently H, F or Cl, n is an integer of 1 to 6. p and q are integers of 2 or more, and p+q>2000. The PVDF-TrFE co-polymer may be a block copolymer, random copolymer, or a combination or blend thereof. The present invention may also relate to an intermediate for making the PVDF-TrFE co-polymer, comprising a plurality of vinylidene fluoride units, a plurality of trifluoroethylene units, and end groups or substituents selected from —I, —OH, —$O_2CR^1$ and —$OSO_2R^2$, where $R^1$ and $R^2$ are independently alkyl, aryl, or aralkyl, which may be substituted or unsubstituted.

The present invention also relates at least in part to methods of making a PVDF-TrFE co-polymer and exchanging an end group of a PVDF-TrFE co-polymer having an iodine, carboxylate, formyl, sulfate, carboxylic acid ester, or hydroxyl end group. The methods (which may also improve the ferroelectric properties of a PVDF-TrFE co-polymer) comprise transforming the end group of the PVDF-TrFE co-polymer to an H, F or Cl atom. End group transformation can be achieved using different approaches, for example by exchanging the iodine end group with a hydrogen atom. The exchange involves the reaction of tin hydride and a radical source with the PVDF-TrFE co-polymer having the iodine end group.

Carbonyl derivatives such as esters, carboxylic acids, carboxaldehydes, etc. that are common end groups for polymers made using many common initiator systems based on peracids, peresters, peroxides (e.g., peroxydisulfates), etc., may be transformed into hydroxyl groups by hydrolysis or treatment with various reducing agents such as boranes. The hydroxyl-terminated PVDF-TrFE co-polymers may then be converted to hydrogen-terminated PVDF-TrFE co-polymers using a Barton McCombie deoxygenation. The hydroxyl end group in such PVDF-TrFE co-polymers may be transformed into an F or Cl atom by reaction with a fluoride ion source (e.g., ammonium fluoride or an alkali metal fluoride and HF-pyridine solution) or a chlorine-containing Lewis acid, respectively.

A difference between low and high molecular weight polymers is that the relative concentration and/or effect of the end group is higher for a low molecular weight polymer. A long polymer provides a high molecular weight, and a long polymer may be desired for applications in printed electronics technology. Since the Van der Waals volume of both hydrogen and fluorine is small and the electrochemical properties are different between the end functionality and the VDF/TrFE monomer units in PVDF-TrFE copolymers having an iodide, carboxylate (e.g., —C(═O)—OH or —C(═O)—O—), formyl (e.g., —C(═O)—H), sulfate, carboxylic acid ester (e.g., R—C(═O)—O-[polymer]), or hydroxyl end group, the effect of the end group on for example the crystallinity and polarization of the polymer is not negligible. Large end groups may be expected to impair the crystallization process and result in larger disorder.

One object of the present copolymer and methods may be to provide an end group that is more similar in size and electrochemical properties to hydrogen or fluorine. The present invention therefore seeks to treat PVDF-TrFE copolymers having a relatively bulky and/or chemically dissimilar end group with a source of hydrogen, fluorine or chlorine atoms in order to exchange the end group with a smaller and/or more chemically similar atom (e.g., hydrogen or fluorine). The present invention may provide an end group transformation scheme that is less harsh than that disclosed in U.S. Pat. Nos. 6,809,166 and 6,828,388, and that is suitable for PVDF-TrFE copolymers.

In one embodiment, exchanging the iodine end group comprises reacting or treating the PVDF-TrFE copolymer having the iodine end group with a tin hydride. To exchange the iodine end group with a hydrogen atom, the iodine-terminated PVDF-TrFE copolymer may be treated with a tin hydride, such tributyltin hydride, and optionally a radical initiator, such as azobisisobutyronitrile (AIBN), to provide a polymer with a hydrogen end group. Alternatively, reaction with a transition metal hydride complex may convert the iodine end group to a hydrogen atom, and may do so catalytically (e.g., in the presence of a pressurized hydrogen atmosphere and heat).

In one embodiment, the method further may comprise a step of borane reduction. By using a step of borane reduction, the borane may reduce the benzoyl group terminated polymer into benzyl alcohol and a hydroxyl terminated polymer. The end group from which the polymerization propagated may thereby be exchanged from the benzoyl group to a hydroxyl group. The step of borane reduction may be followed by a Barton McCombie deoxygenation process.

According to another aspect of the invention, a method of making a PVDF-TrFE co-polymer may be provided, the method comprising polymerizing VDF and TrFE using an initiator that introduces a bulky end group into the PVDF-TrFE co-polymer, optionally terminating the polymerization (e.g., in a separate step or in situ), and converting the end group of the PVDF-TrFE co-polymer into a hydrogen, fluorine or chlorine atom. For example, the initiator may be or comprise a diaroyl or dialkanoyl peroxide (e.g., benzoyl peroxide) or a peroxydisulfate (e.g., ammonium peroxydisulfate). Alternatively, the VDF and TrFE may be polymerized in the presence of a (fluoro)alkyl iodide or a (fluoro) alkylene diiodide (e.g., iodine transfer polymerization), and the initiator may comprise an azo compound, such as AIBN. Furthermore, a terminating agent may be introduced during the polymerization reaction. The terminating agent may be selected to provide the PVDF-TrFE co-polymer with a hydrogen, fluorine or chlorine end group, or a precursor to a hydrogen, fluorine or chlorine atom end group (e.g., a hydroxyl group). The initiator may in one embodiment also be used as terminating agent. The introduction of a termination agent may then be provided by using the already provided initiator.

The PVDF-TrFE may be synthesized using a radical polymerization technique, either as a suspension or as an emulsion. In order to initiate the polymerization, an initiator may be used, and in order to terminate the reaction a termination agent may be introduced into the polymerization reactor. After polymerization, the polymer may aside from the VDF and TrFE residues comprise a residue or functional group from the initiator at one end, such as a benzoyl group (if benzoyl peroxide is used as the initiator), and some other functionality at the other end(s), depending on how the polymerization and/or termination was done.

The radical initiator and termination agent may be selected such that they result in end group functionalities that are more similar in size and electrochemical properties to hydrogen or fluorine, or the PVDF-TrFE copolymer may be treated post-polymerization to exchange the bulky end group(s) to smaller atoms (e.g., hydrogen or fluorine).

The peroxydisulfate may be or comprise ammonium persulfate $((NH_4)_2S_2O_8)$, sodium persulfate $(Na_2S_2O_8)$, or potassium persulfate $(K_2S_2O_8)$, the latter two of which may be particularly useful in emulsion-type polymerization. A radical peroxydisulfate initiator may generate a sulfate-terminated end group. The sulfate end group may be hydrolyzed, resulting in formation of hydroxyl-, formyl-, and/or carboxylic acid-/carboxylate-terminated polymers.

In one embodiment, the method may comprise a step of introducing a radical scavenger or chain transfer agent into the polymerization reaction, said radical scavenger or chain transfer agent including a hydrogen, fluorine, or chlorine atom donating group. The step of introducing a radical scavenger or chain transfer agent may be a part of a step of introducing a termination agent in order to terminate the reaction.

The introduction of such radical scavenger or chain transfer agent may provide that the polymer termination end group is formed by a hydrogen, fluorine or chlorine group.

In a further embodiment, the initiator may be a radical initiator, and the method may further comprise homolyzing the radical initiator. The radical initiator may comprise, e.g., a diaroyl peroxide such as benzoyl peroxide that, upon heating, undergoes homolysis and generates two free radicals which initiates the polymerization.

According to a further aspect of the invention, a PVDF-TrFE co-polymer is provided, comprising at least one end group being a hydrogen group, a fluorine group or a chlorine group that may be made according to the methods disclosed herein.

According to a final aspect of the invention, the use of a PVDF-TrFE co-polymer as above is provided as ferroelectric, electromechanical, piezoelectric or dielectric material in the manufacture of electronic devices.

These and other advantages of the present invention will become readily apparent from the detailed description of various embodiments below.

DETAILED DESCRIPTION

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components and materials have not been described in detail so as not to unnecessarily obscure aspects of the present invention.

The technical proposal(s) of embodiments of the present invention will be fully and clearly described in conjunction with the drawings in the following embodiments. It will be understood that the descriptions are not intended to limit the invention to these embodiments. Based on the described embodiments of the present invention, other embodiments can be obtained by one skilled in the art without creative contribution and are in the scope of legal protection given to the present invention.

Furthermore, all characteristics, measures or processes disclosed in this document, except characteristics and/or processes that are mutually exclusive, can be combined in any manner and in any combination possible. Any characteristic disclosed in the present specification, claims, Abstract and Figures can be replaced by other equivalent characteristics or characteristics with similar objectives, purposes and/or functions, unless specified otherwise.

The advantages of the present invention will become readily apparent from the detailed description of various embodiments below.

Figure 1:
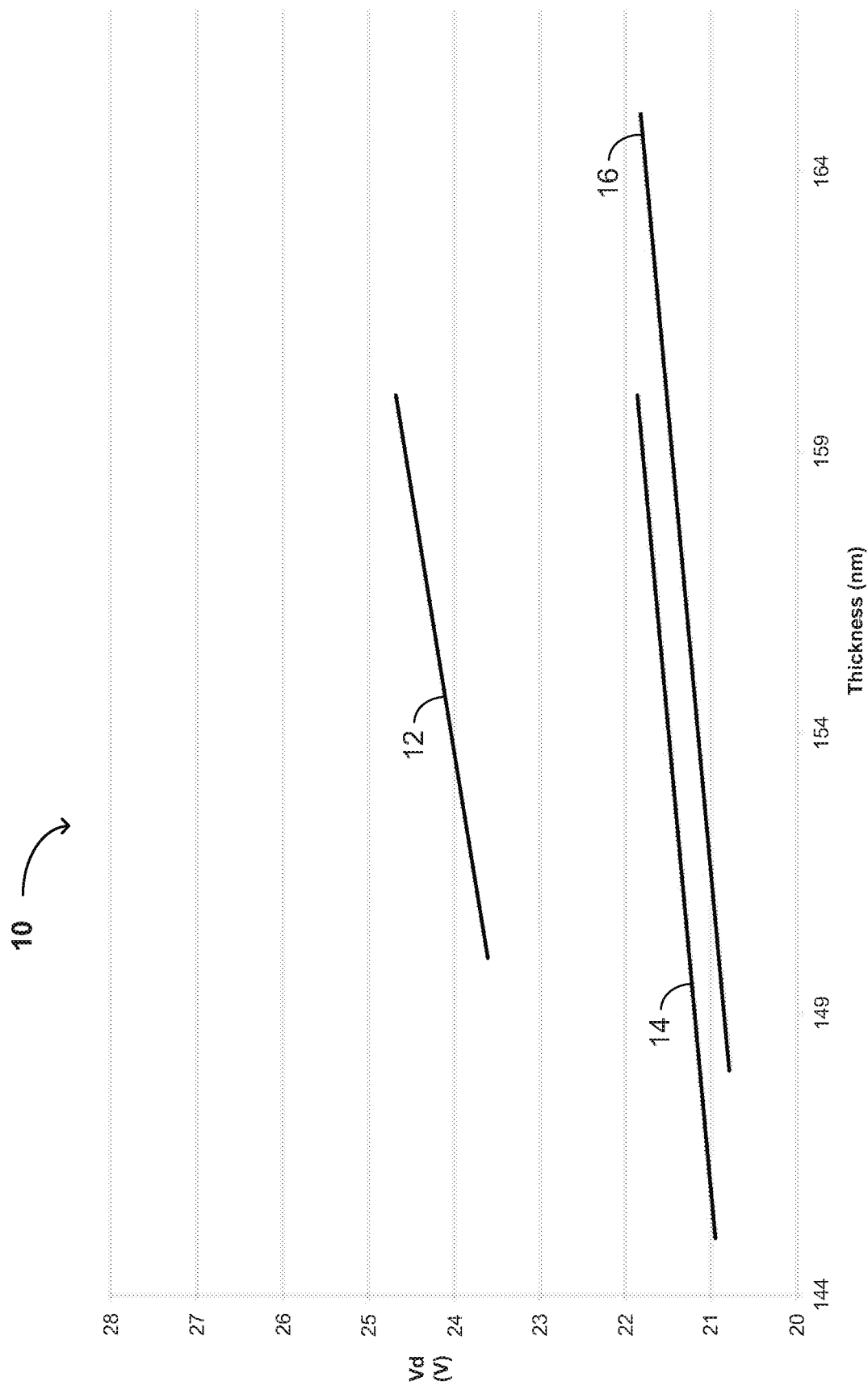
FIG. 1 shows a diagram of drive voltage as function of PVDF-TrFE polymer thickness and molecular weight.

FIG. 1 is a graph 10 that illustrates how the drive voltage that switches the state of a ferroelectric memory including a PVDF-TrFE co-polymer depends on the molecular weight of the PVDF-TrFE co-polymer. As shown by lines 12, 14 and 16, a memory using a polymer with high molecular weight (e.g., 600 kDa, line 16) can be switched at a lower drive voltage than a polymer with low molecular weight (e.g., 370 kDa, line 12, or 450 kDa, line 14). This lower drive voltage switching is desirable, but a high molecular weight PVDF-TrFE co-polymer has disadvantages, such as being less soluble, and a solution of the polymer has higher viscosity at the same mass loading. A high viscosity is a disadvantage during filtration and possibly during coating (e.g., there may be problems such as lower uniformity of the film thickness when forming the memory using a coating method).

Thus, one objective of the present invention is to provide PVDF-TrFE copolymers with an end group that is more similar in size and electrochemical properties to hydrogen or fluorine, thereby enabling use of a smaller molecular weight PVDF-TrFE copolymer at lower drive voltages for switching the state of a ferroelectric memory. However, as is known in the art, PVDF-TrFE copolymers have other uses as well (e.g., as transparent protective films, waterproofing agents, UV- and graffiti-resistant paints, low-temperature gaskets in aeronautical and aerospace applications, core and cladding materials in fiber optics, etc.), and such other uses may also benefit from a smaller molecular weight PVDF-TrFE copolymer with a H, F or Cl atom end group in place of a bulky or chemically dissimilar end group (which is believed to improve crystallinity of the copolymer).

A "high molecular weight polymer" may refer to a polymer having a molecular weight of at least 600 kDalton. A "low molecular weight polymer" may refer to a polymer having a molecular weight of less than 600 kDalton. The present invention may be used to improve the ferroelectric properties of both low and high molecular weight polymers, but in particular it may significantly improve the properties for polymers with a molecular weight of less than 800 kDalton. Thus, the present PVDF-TrFE copolymer may have a molecular weight in the range of 100-800 kDa (e.g., 200-600 kDa, 100-300 kDa, or any value or range of values within the range of 100-800 kDa).

One aspect of the present invention relates to a PVDF-TrFE co-polymer comprising a plurality of vinylidene fluoride units, a plurality of trifluoroethylene units, and end groups or substituents selected from H, F and Cl. The PVDF-TrFE co-polymer may be a block copolymer, random copolymer, or a combination or blend of block and/or random copolymers. The monomers in any such block or random copolymer can be linked in head-to-head, head-to-tail or tail-to-tail orientations.

For example, the PVDF-TrFE co-polymer may have a formula $X^1$—$(C_2H_2F_2)_p$—$(C_2HF_3)_q$—$X^2$, where $X^1$ is R, H, F or Cl, R is a $C_n$-alkyl group that may contain from 1 to 2n+1 fluorine atoms, $X^2$ is independently H, F or Cl, n is an integer of 1 to 6. p and q are integers of 2 or more, and p+q>2000. More typically, p+q>2500, 3000, or 3500, and can be as high as 10,000, 15,000 or 20,000. The ratio of p to q can vary widely, and can be for example from 10:90 to 90:10 (or any ratio or range of ratios therein).

The PVDF-TrFE co-polymer may further contain additional alkene and/or cycloalkene monomers that include one or more fluorine atoms. For example, the additional monomers may have the formula $C_pH_qF_r$, where p is 3 or more (e.g., 3 to 8 when the additional monomer is an alkene, and 5 or 6 when the additional monomer is a cycloalkane), r is from 1 to 2p, and (q+r)=(2p−2) or 2p. For example, the additional monomers can include perfluoro-propene, 1,1,1,3,3-pentafluoroprop-2-ene, 1,1,1-trifluoroprop-2-ene, 1,1,2-trifluoroprop-1-ene, 1,1-difluoropropene, 1,1,1,2,2-pentafluorobut-3-ene, perfluorocyclopentene, etc. In general, the PVDF-TrFE co-polymer can be any fluorinated polyalkene having a ratio of F atoms to H atoms >1:1 and <3:1 (e.g., from 7:5 to 2:1, or any other value or range of values between 1:1 and 3:1).

The present invention also related to a post treatment process for a low molecular weight PVDF-TrFE copolymer to emulate the good ferroelectric properties of a high molecular weight PVDF-TrFE copolymer polymer.

Figure 2A:
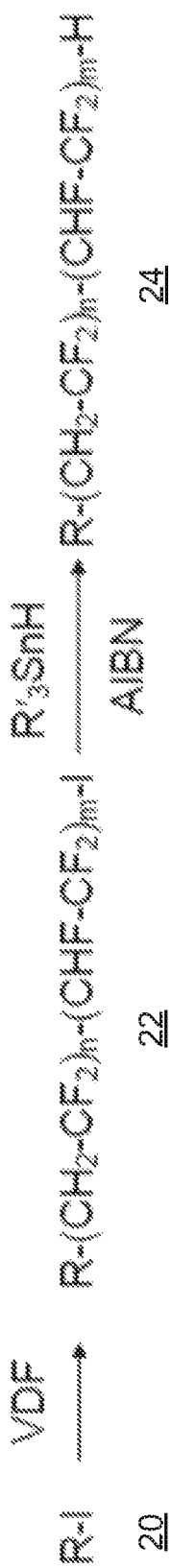
FIGS. 2A-B show exemplary end group transformations according to embodiments of the invention.
Figure 2B:
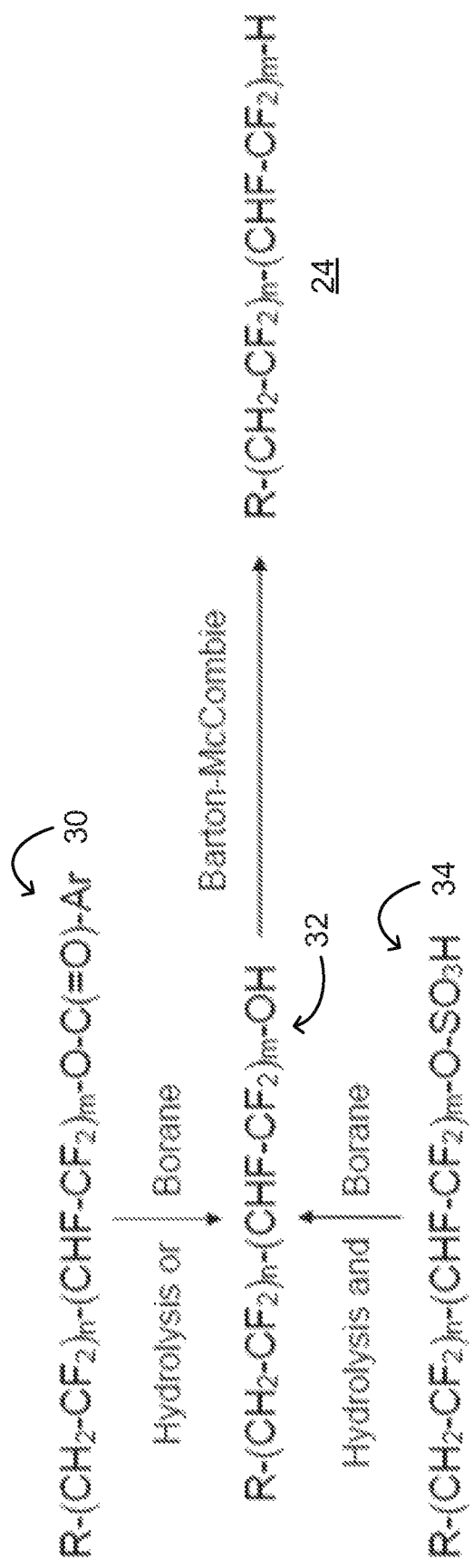

As illustrated in FIGS. 2A-B, the method according to an embodiment of the present invention exchanges or converts a bulky end group of a PVDF-TrFE copolymer to an H atom. Variants of the scheme shown in FIG. 2B can exchange or convert a hydroxyl end group of a PVDF-TrFE copolymer to an F or Cl atom. For example, an I end group can be replaced with H as shown in the second reaction of FIG. 2A generally as follows.

A relatively low molecular weight iodine-terminated copolymer 22 is dissolved (e.g., optionally with heating) in a suitable solvent (e.g., one that generally does not react with radical initiators, even when heated up to its boiling point). The amount of PVDF-TrFE copolymer 22 can be any that is soluble in the solvent but a typical amount is from 1% to 20% by weight (e.g., 5%). The solvent may be one or more of $C_6$-$C_{12}$ alkanes (which may be linear, branched or cyclic), $C_6$-$C_{10}$ arenes (which may be substituted with one or more fluorine atoms and/or $C_1$-$C_4$ alkyl groups, each of which may be substituted with one or more fluorine atoms) such as benzene or toluene, a $C_1$-$C_4$ alkyl ester of a $C_1$-$C_4$ alkanoic acid such as ethyl acetate, a dialkyl or cyclic alkylene ether having from 4 to 10 carbon atoms (e.g., diethyl ether, methyl t-butyl ether, tetrahydrofuran [THF], dioxane), etc. The mixture may be heated at any temperature greater than room temperature, up to the boiling point of the solvent. However, solvents having a boiling point of at least 50° C., up to about 150° C., may be particularly suitable. Also, a solvent having some polarity (e.g., esters, cyclic ethers) may be preferable to one that is nonpolar (e.g., alkanes, unsubstituted arenes). In one example, the PVDF-TrFE copolymer 22 is dissolved in ethyl acetate at 70° C.

The solution of copolymer 22 may be cooled and optionally filtered through a 0.2 μm filter (to remove insoluble matter). The solution of copolymer 22 is then reacted with a hydrogen source and/or an iodine extractor, such as $Bu_3SnH$ and AIBN, as shown in FIG. 2A. However, other iodine extractors (e.g., sources of radicals that form reasonable strong bonds with I) and hydrogen sources (e.g., aliphatic tin hydrides, aliphatic aluminum hydrides, alkali metal borohydrides, transition metal hydride complexes) may be used as well.

For example, a solution of iodine-terminated PVDF-TrFE copolymer 22 (e.g., in a relatively polar solvent such as ethyl acetate) is reacted with excess $Bu_3SnH$ and an amount of AIBN effective to initiate the iodine extraction at 70° C. for a length of time sufficient to substantially complete the hydrogen exchange (e.g., 2 h). The reaction mixture may then be cooled (e.g., to room temperature or 0° C.), and triturated with a nonpolar solvent (e.g., an alkane such as n-heptane). The resultant polymer precipitate is collected by filtration. Any remaining reactants and byproducts may be removed by heating the polymer precipitate in a small amount of a mixture of a relatively polar solvent (e.g., ethyl acetate) and a nonpolar solvent (e.g., n-heptane). The ratio of polar solvent to nonpolar solvent may be at least 1:1 by volume (e.g., 1 part of polar solvent to 2 or more parts of nonpolar solvent by volume). The remaining polymer is removed by filtration. After any such polymer washing is completed, the polymer may be re-dissolved (e.g., in a dialkyl ester such as ethyl acetate) and filtered with a 0.2 μm filter to give the desired H-terminated polymer 24 as a solution. Thus, to increase the crystalline content and/or improve the ferroelectric properties of a low molecular weight, iodine-terminated PVDF-TrFE copolymer 22, the iodine end group is replaced with a hydrogen group. This is done using a hydrogen source such as $R'_3Sn$—H and an initiator such as azobisisobutyronitrile (AIBN), which provides a polymer 24 having a hydrogen end group (e.g., of the formula R—$(CH_2$—$CF_2)_n$—$(CHF$—$CF_2)_m$—H). The replacement of the iodine end group may alternatively be with a fluorine group. For example, a halogen exchange reaction of the iodine-terminated PVDF-TrFE copolymer 22 with an alkali metal fluoride and/or silver fluoride under conventional conditions may provide a polymer of the formula R—$(CH_2$—$CF_2)_n$—$(CHF$—$CF_2)_m$—F. Further, the iodine end group may instead be replaced with a chlorine atom by treatment with HCl and $HNO_3$, thereby providing a polymer of the formula R—$(CH_2$—$CF_2)_n$—$(CHF$—$CF_2)_m$—Cl.

Referring now to FIG. 2B, an ester-terminated PVDF-TrFE copolymer 30 (e.g., R—C(=O)—O-[polymer]) may be converted to a hydroxyl-terminated PVDF-TrFE copolymer 32 by hydrolysis or borane reduction. In turn, the hydroxyl-terminated PVDF-TrFE copolymer 32 may be converted to a hydrogen-terminated PVDF-TrFE copolymer 34 by Barton-McCombie or similar reduction.

For example, for the hydrolysis reaction, a solution of the ester-terminated PVDF-TrFE copolymer 30 may be prepared substantially as described above, but the solvent should be one that is not subject to hydrolysis itself (e.g., an ester), and should dissolve water at least slightly at room temperature and/or at an elevated temperature. Thus, the solvent may be one or more of $C_6$-$C_{10}$ arenes (which may be substituted with one or more fluorine atoms and/or $C_1$-$C_4$ alkyl groups, each of which may be substituted with one or more fluorine atoms) such as benzene or toluene, dialkyl ketones having from 3 to 8 carbon atoms such as acetone or methyl ethyl ketone, dialkyl or cyclic alkylene ethers having from 4 to 10 carbon atoms (e.g., diethyl ether, methyl t-butyl ether, tetrahydrofuran, dioxane), $C_1$-$C_6$ alkanes substituted with one or more halogen atoms such as F and/or Cl that are in the liquid phase at room temperature, the $C_3$-$C_6$ variants of which may be linear, branched or cyclic, etc.

The hydrolysis reaction mixture generally includes water (e.g., deionized and/or distilled water) or a water precursor, and a hydrolysis catalyst. The catalyst may be or comprise a mild acid, such as a $C_1$-$C_6$ alkanoic acid (e.g., formic acid or acetic acid), the $C_2$-$C_6$ variants of which may be substituted with one or more halogens such as F or Cl (e.g., trifluoroacetic acid), and the $C_3$-$C_6$ variants of which may be linear or branched. Other relatively mild acids that are soluble in organic solvents and that do not decompose in the presence of water are also generally suitable. The hydrolysis reaction mixture may be heated to a temperature of up to the boiling point of the solvent, and may be conducted for a length of time sufficient to hydrolyze most or substantially all of the ester groups in the ester-terminated PVDF-TrFE copolymer 30 (e.g., 2-24 hours). The hydroxyl-terminated PVDF-TrFE copolymer 32 may be purified as described above for the hydrogen-terminated PVDF-TrFE copolymer 24, but the polar:nonpolar solvent mixture ratio in the polymer wash may be lower than for the hydrogen-terminated PVDF-TrFE copolymer 24 (e.g., 1:5 or more parts by volume).

Alternatively, the solution of the ester-terminated PVDF-TrFE copolymer 30 may be reacted with a borane or borohydride (e.g., a compound of the formula $BH_xR^3_{3-x}$ [which may be complexed with a Lewis base such as a trialkyl amine or a dialkyl ether], $B_aH_b$, or $MBH_yR^3_{4-y}$, where each $R^3$ is independently alkyl, aryl, or aralkyl, which may be substituted or unsubstituted, and 2 of which (when present) can form a ring, x is an integer of 1, 2 or (when complexed with a Lewis base) 3, a is an integer of from 2 to 20, b is an integer of from a to the number of binding sites on the a B atoms, M is an alkali metal or quaternary ammonium ion, and y is an integer of from 1 to 4. Conditions for reducing an ester with a borane or borohydride are generally the same as those known in the art (e.g., by heating or refluxing in one or more organic solvents such as $C_4$-$C_{10}$ alkanes and cycloalkanes that are liquid at room temperature and that may be partially or completely substituted with fluorine atoms, $C_6$-$C_{10}$ arenes, which may be substituted with one or more fluorine atoms and/or $C_1$-$C_4$ alkyl groups, each of which may be substituted with one or more fluorine atoms; a dialkyl or cyclic alkylene ether having from 4 to 10 carbon atoms; etc.). The reaction may be terminated or quenched by washing with deionized water, brine, mild alkali (e.g., 5% aqueous sodium bicarbonate solution), mild acid (e.g., 0.5% aqueous HCl or saturated or dilute aqueous ammonium chloride solution), etc. The hydroxyl-terminated PVDF-TrFe copolymer 32 may be purified as described above.

As is shown in the lower reaction in FIG. 2B, a sulfate-terminated (e.g., —$OSO_3$(H)) polymer 34 can be converted to a hydroxyl-terminated polymer 32. Emulsion polymerization of PVDF-TrFE using an inorganic peroxydisulfate (e.g., $M_2S_2O_8$, where M is an alkali metal or an ammonium ion) as an initiator will nominally generate a sulfate-terminated polymer 34. The sulfate functionality is very prone to hydrolysis, and will often spontaneously decompose into a hydroxyl-terminated polymer 32.

However, in a PVDF-TrFE copolymer, the initial and/or terminal monomer can either be VDF or TrFE, and depending on the monomer and its orientation (e.g., head-to-head, head-to-tail or tail-tail), the carbon atom at a terminus of the PVDF-TrFE copolymer chain that bears a terminal hydroxyl group is substituted with 0, 1 or 2 fluorine atoms. When the hydroxyl-bearing carbon atom(s) in PVDF-TrFE copolymer have no fluorine atoms, the hydroxyl-terminated polymer is generally stable, and can be used in the end group transformation of —OH to hydrogen, fluorine, or chlorine. However, the fluorine atoms on the hydroxyl-bearing carbon atom generally spontaneously decompose in water, thereby transforming the hydroxyl group into an aldehyde (e.g., formyl, or —C(=O)H) or carboxylic acid group (e.g., carboxyl, or —C(=O)OH). This results in a mixture of hydroxyl-, formyl- and carboxyl-terminated PVDF-TrFE copolymers.

To use the formyl- and carboxyl-terminated PVDF-TrFE copolymers in a subsequent end group transformation reaction, they must first be converted to a hydroxyl-terminated PVDF-TrFE copolymer. In general, conditions for reducing the formyl and carboxyl end groups to a hydroxyl (e.g., hydroxymethyl) end group may be as follows.

A solution of the carboxyl-, formyl- and hydroxyl-terminated polymers, prepared by heating in a suitable inert solvent, such as partially fluorinated hydrocarbons, as described above can be treated with an excess of a borane or borohydride, as described for the ester reduction above. The reaction may be conducted at a temperature of from 0° to the boiling point of the solvent, for a length of time sufficient to reduce most or substantially all of the formyl and carboxyl groups to hydroxy groups or hydroxy group precursors (e.g., —$O^-$). For example, the reaction can be conducted for a length of time of from 1 hour to 48 hours (or any length of time or range of times therein). In one example, a 5 wt. % solution of the carboxyl-, formyl- and hydroxyl-terminated polymers can be reacted with a borane etherate reducing agent (e.g., $BH_3.OEt_2$ or $BH_3.THF$) at room temperature overnight (e.g., for about 16 h.). The mixture can be quenched by addition of an ammonium chloride solution, and the organic phase can be separated and/or collected to isolate the desired hydroxyl-terminated polymer. Purification of the hydroxyl-terminated polymer can be performed as described herein.

As is shown in the center reaction in FIG. 2B, the hydroxyl-terminated PVDF-TrFE copolymer 32 can be converted to a hydrogen-terminated PVDF-TrFE copolymer 24 by Barton-McCombie reduction. For example, the hydroxyl-terminated PVDF-TrFE copolymer 32 can be converted to a xanthate-terminated PVDF-TrFE copolymer, followed by reduction with a tin hydride (e.g., $Bu_3SnH$). General reaction conditions for the Barton-McCombie reduction are as follows.

A solution of the hydroxyl-terminated polymer 32 as described above can be reacted with an excess of a deprotonating agent. For example, the deprotonating agent may be one that irreversibly deprotonates the terminal hydroxyl groups, such as dry sodium hydride. The deprotonation may be conducted at a temperature of from −78° C. to room temperature, or any temperature or range of temperatures therein (e.g., at 0° C.). Carbon disulfide (e.g., in excess) can then be added to the deprotonated hydroxyl-terminated PVDF-TrFE copolymer 32. The mixture can be reacted for a length of time sufficient to convert most or substantially all of the hydroxyl end groups to xanthate end groups. For example, the mixture can be stirred at a temperature of from 0° C. to the boiling point of the solvent (e.g., room temperature) for 1-48 hours (e.g., overnight, or about 16 h.).

The xanthate-terminated PVDF-TrFE copolymer can be reacted with an alkylating agent (e.g., a primary alkyl iodide, such as methyl iodide; a trialkyl oxonium salt, such as triethyloxonium tetrafluoroborate; etc.) in situ. For example, an alkyl iodide can be added to the xanthate-terminated PVDF-TrFE copolymer at the end of the xanthate conversion reaction, and the mixture stirred at a temperature sufficient to alkylate most or substantially all of the xanthate groups (e.g., from 0° C. to the boiling point of the solvent (e.g., room temperature) for 1-48 hours (e.g., about 24 h). The alkylation reaction can be quenched with a proton source, such as an alcohol (e.g., a $C_1$-$C_4$ alkanol, the $C_3$ and $C_4$ variants of which can be linear or branched), water, aqueous sodium bicarbonate, aqueous ammonium chloride, etc. In one example, the alkylation reaction is quenched by careful addition of ethanol, followed by washing with saturated aqueous sodium bicarbonate. The organic layer can be separated and dried (e.g., with $MgSO_4$) prior to the reduction to a hydrogen-terminated PVDF-TrFE copolymer.

The alkyl xanthate-terminated PVDF-TrFE copolymer can be reacted with a hydrogen source (e.g., $Bu_3SnH$) and a radical source (e.g., AIBN). Alternatively, the hydrogen source can be or comprise a mixture of hypophosphorous acid and a trialkylamine such as trimethylamine, or a combination of a trialkylborane with a small amount of water (e.g., which can be provided by air, which can also provide dioxygen as a radical source).

For example, $Bu_3SnH$ and AIBN can be added to a solution of the alkyl xanthate-terminated PVDF-TrFE copolymer, and optionally, the reaction mixture (or one or more components thereof) can be diluted with a solvent (e.g., $C_6$-$C_{10}$ arenes that may be substituted with one or more fluorine atoms and/or $C_1$-$C_4$ alkyl groups [each of which may be substituted with one or more fluorine atoms], such as benzene or toluene, one or more $C_6$-$C_{10}$ linear, branched or cyclic alkanes that may be substituted with one or more fluorine atoms, a dialkyl or cyclic alkylene ether having from 4 to 10 carbon atoms, etc.). The reaction mixture may be conducted at room temperature (depending on the radical source/initiator) or heated to a temperature of about 30° C. to the boiling point of the solvent (e.g., 65-150° C. or any temperature or range of temperatures therein, such as about 100° C.) for a length of time sufficient to replace most or substantially all of the alkyl xanthate end groups with hydrogen atoms. This length of time may be from 15 minutes to 24 hours, or any length of time or range of time periods therein (e.g., about 2 h.). The reaction may be quenched by adding a solvent (e.g., $C_6$-$C_{10}$ linear, branched or cyclic alkanes that may be substituted with one or more fluorine atoms, $C_6$-$C_{10}$ arenes that may be substituted with one or more fluorine atoms and/or $C_1$-$C_4$ alkyl groups, dialkyl or cyclic alkylene ethers having from 4 to 10 carbon atoms, etc.) For example, the reaction may be quenched by adding a nonpolar solvent (such as n-heptane), which may precipitate the hydrogen-terminated PVDF-TrFE copolymer 24. Prior to quenching, the mixture may be concentrated by evaporation of excess solvent, especially if one or more of the initial reactants are diluted. The hydrogen-terminated polymer 24 can be collected by filtration, and purified by heating (e.g., at reflux) in a relatively polar solvent such as methanol or ethanol and filtering.

Alternatively, one may convert the hydroxyl-terminated PVDF-TrFE copolymer 32 to a Cl-terminated PVDF-TrFE copolymer using a phosphorous chloride, such as $PCl_3$, $PCl_5$, $POCl_3$, etc., using the following procedure. For example, the hydroxyl-terminated polymer solution (as described herein) may be treated with excess $PCl_3$ by stirring at a temperature and for a length of time sufficient to replace most or substantially all of the hydroxyl end groups with chlorine atoms. The temperature may be from about 0° C. to the boiling point of the solvent or any temperature or range of temperatures therein (e.g., room temperature, 35-150° C., etc.). The length of time may be from 1 to 48 hours, or any length of time or range of time periods therein (e.g., about 24 h.). The reaction may be quenched by addition of an agent that hydrolyzes a phosphorous halide and optionally neutralizes any resulting acid, such as deionized water, an aqueous alkali metal bicarbonate (e.g., as a 5 wt. % or saturated solution), an aqueous ammonium or alkali metal carbonate solution, etc. The organic phase can be separated and/or collected, and optionally dried with a dehydrating agent (e.g., $MgSO_4$, $CaCl_2$, etc.) to give a solution of the chlorine-terminated polymer.

Any of these polymers, with H, F or Cl end group, may provide a PVDF-TrFE copolymer with improved ferroelectric properties. In general, the smaller the molecular weight of the PVDF-TrFE copolymer, the greater the improvement.

An embodiment of the present invention further relates to a method of improving a ferroelectric property of a PVDF-TrFE co-polymer having a bulky end group, or an end group that is chemically dissimilar from H and F. The method comprises performing an end group transformation on the PVDF-TrFE co-polymer to convert the bulky or chemically dissimilar end group to an H, F, or Cl end group. In some embodiments, the bulky or chemically dissimilar end group is first converted to a hydroxyl group, then to the H, F, or Cl end group. The bulky or chemically dissimilar end group may be or comprise a sulfate, carboxyl, carboxylic acid, carboxylic acid ester, carbonyl (e.g., formyl or —C(=O)—$R^4$, where $R^4$ is a $C_1$-$C_6$ linear, branched or cyclic alkyl group that may be substituted with one or more fluorine atoms), or hydroxyl group, and the end group transformations may be performed as described herein. The PVDF-TrFE copolymer may have a molecular weight as described herein. The method may further comprise purifying the PVDF-TrFE copolymer as described herein.

The present invention also relates to a method of making a PVDF-TrFE copolymer. The method of making generally comprises polymerizing a mixture of vinylidene difluoride (VDF) and trifluoroethylene (TrFE) using a radical initiator that results in the resulting PVDF-TrFE copolymer having a bulky or chemically dissimilar end group, and transforming the bulky or chemically dissimilar end group to an H, F, or Cl end group. In some embodiments, the radical initiator is a peroxide (e.g., an inorganic peroxide, such as an alkali metal, ammonium [$NH_4^+$], or quaternary ammonium peroxydisulfate, or an organic peroxide, such as a dialkanoyl or diaroyl peroxide). In other embodiments, the radical initiator is a combination of a radical source (e.g., AIBN) and an alkyl iodide or alkylene diiodide, which may be substituted with one or more fluorine atoms. The bulky or chemically dissimilar end group is transformed to an H, F, or Cl end group in accordance with the above disclosure.

Polymerization using the peroxide radical initiator may comprise an emulsion polymerization technique, a suspension polymerization technique, or a solution polymerization technique. Particular examples of peroxide radical initiators that form a bulky or chemically dissimilar end group include ammonium peroxydisulfate ($[NH_4]_2[S_2O_8]$) and benzoyl peroxide (PhC(=O)—O—O—C(=O)Ph).

The polymerization may also be performed using an iodine transfer polymerization technique. In the iodine transfer polymerization, the radical initiator may comprise a radical source such as AIBN and an alkyl iodide of the formula R—I or an alkylene diiodide of the formula I—R'—I, where R is a $C_1$-$C_6$ alkyl group that may contain one or more fluorine atoms, the $C_3$ to $C_6$ variants of which may be linear, branched or cyclic, and R' is a $C_2$-$C_6$ alkylene group that may contain one or more fluorine atoms, the $C_3$ to $C_6$ variants of which may be linear, branched or cyclic. In some embodiments, the alkyl iodide or alkylene diiodide are perfluorinated, other than the iodine atoms. Examples of suitable alkyl iodides and alkylene diiodides include trifluoroiodomethane, pentafluoroiodoethane, 1,1,1-trifluoro-2-iodoethane, heptafluoro-1-iodopropane, 1,1,2,2-tetrafluoro-3-iodopropane, nonafluoro-1-iodobutane, 1,1,1,2,2-pentafluoro-4-iodobutane, 1,2-diiodotetrafluoroethane, 1,1-difluoro-1,2-diiodoethane, 1,2-difluoro-1,2-diiodoethane, etc. The result is a polymer with one or more iodine end groups. Solvents, reaction temperatures, work-ups and purification processes for fluorinated polymers made using iodine transfer polymerization are known to those skilled in the art.

In some embodiments, the radial initiator may also serve as a terminating agent. This approach works when the terminating species is present in a lower concentration (e.g., than the initiating species) for at least some part of the reaction sequence, and the fluorinated alkene (e.g., VDF and TrFE) monomers have sufficiently higher reactivity than the initiator towards the polymer radicals during polymerization. Light having a predetermined (e.g., radical-forming) wavelength may be applied during part of the reaction to assist in the formation of the radical initiators.

In further embodiments, the method may comprise introducing a radical scavenger or chain transfer agent into the polymerization reaction. The radical scavenger or chain transfer agent generally includes a hydrogen, fluorine, or chlorine atom donating group. Introducing the radical scavenger or chain transfer agent may be part of the introduction of a termination agent in order to terminate the polymerization reaction, and the radical scavenger or chain transfer agent may provide a hydrogen, fluorine or chlorine end group at one or more terminals of the polymer. Examples of such radical scavengers or chain transfer agents include chloroform and carbon tetrachloride.

Next, the iodine or other bulky or chemically dissimilar end group is transformed into a hydrogen, fluorine or chlorine end group as described herein. Such fluorinated co-polymer material may be used in an electronic device having a lower drive voltage than a device using a similar or identical polymer material in which the bulky or chemically dissimilar end groups have not been transformed or exchanged.

Figure 3:
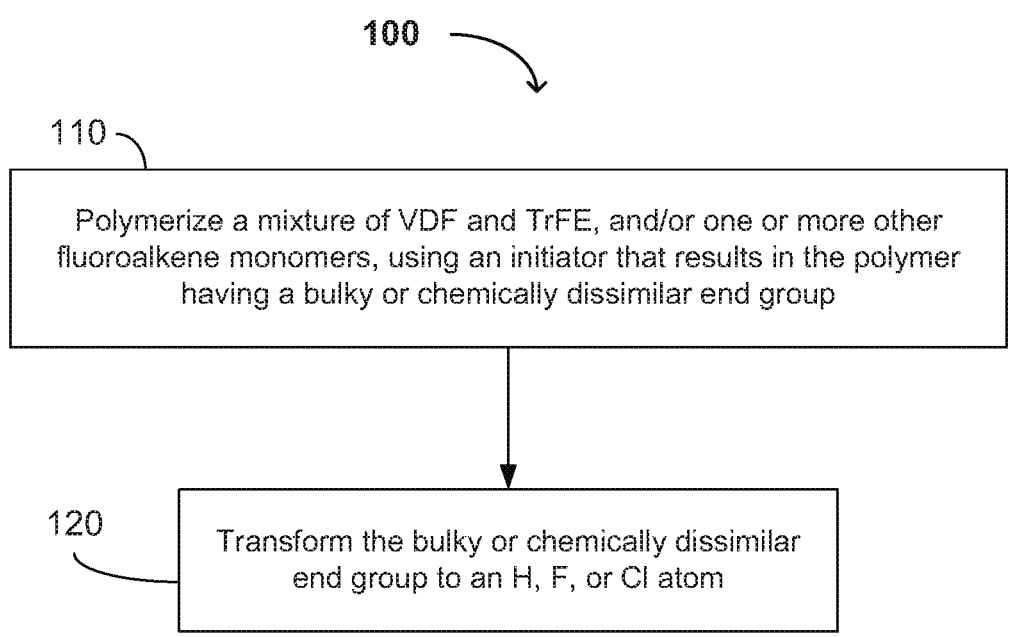
FIG. 3 is a flow chart showing an exemplary polymerization method according to one or more embodiments of the invention.

FIG. 3 illustrates a flow chart of a method 100 of manufacturing a PVDF-TrFE co-polymer according to an embodiment of the invention. The method 100 comprises, at 110, polymerizing a mixture of VDF and TrFE using an initiator, as described herein. The mixture may include additional (fluorinated) alkene monomers, or may include completely different fluoroalkene monomer(s). The initiator may be or comprise iodine, a mixture of AIBN and an alkyl iodide or alkylene diiodide, benzoyl peroxide or a peroxydisulfate. In any case, the initiator results in the PVDF-TrFE co-polymer having a bulky end group or an end group that is chemically dissimilar from an H or F atom.

At 120, the method comprises transforming the bulky or chemically dissimilar end group to an H, F, or Cl atom. In one embodiment, the method 100 may comprise a borane reduction of a carbonyl (i.e., —C(=O)—) group-containing end group, followed by a Barton-McCombie reduction.

The fluorinated copolymer may then be terminated without the addition of a specific or harsh termination reagent, meaning that the polymer could have the same termination on both sides (i.e., the residue from the initial end of the polymer is the same as the terminal end). The bulky or chemically dissimilar end group is typically an ester from a perester initiator, or a sulfate from a peroxydisulfate initiator. The latter may spontaneously hydrolyze into hydroxyl, aldehyde or carboxylic acid end groups. A reducing agent (e.g., a borane) will react with the aldehyde or carboxylic acid terminal functionalities (i.e., end groups) to generate a hydroxyl-terminated polymer. In one embodiment, the hydroxyl group-terminated polymer is then deoxygenated or reduced using a Barton McCombie reduction process. More specifically, the hydroxyl-terminated polymer is converted into a thiocarbonate and subsequently treated with $Bu_3SnH$ and a source of radicals such as triethylborane/$O_2$ or AIBN to provide the hydrogen-terminated polymer.

In the drawings and specification, there have been disclosed specific embodiments and examples of the invention and, although specific terms are employed, they are used in a generic and descriptive sense only, and not for the purpose of limitation, the scope of the invention being set forth in the following claims.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application. It is intended that the scope of the invention be defined by the claims appended hereto and their equivalents.

What is claimed is:

1. A method of forming an electronic device, comprising depositing a PVDF-TrFE co-polymer on a substrate as a ferroelectric, electromechanical, piezoelectric or dielectric material in the electronic device, wherein the PVDF-TrFE co-polymer has a formula $X^1$—$(C_2H_2F_2)_p$—$(C_2HF_3)_q$—$X^2$, where $X^1$ is R, H, F or Cl, R is a $C_n$-alkyl group that may contain from 1 to 2n+1 fluorine atoms, $X^2$ is independently H, F or Cl, n is an integer of 1 to 6, p and q are integers of 2 or more, and $2500<p+q<20,000$.

2. The method of claim 1, wherein, prior to depositing the PVDF-TrFE co-polymer on the substrate, the PVDF-TrFE co-polymer includes an iodine or hydroxyl end group, and the method further comprises exchanging the iodine or hydroxyl end group on the PVDF-TrFE co-polymer with an end group selected from H, F and Cl.

3. The method of claim 2, wherein the iodine or hydroxyl end group on the PVDF-TrFE copolymer is the iodine end group, the iodine end group is exchanged with the H end group, and exchanging the iodine end group with the H end group comprises reacting the PVDF-TrFE co-polymer having the iodine end group with (i) a tin hydride and a radical initiator, (ii) a transition metal hydride complex in a pressurized hydrogen atmosphere and in a presence of heat, or (iii) an iodine extractor and a hydrogen source selected from the group consisting of aliphatic tin hydrides, aliphatic aluminum hydrides, alkali metal borohydrides, and transition metal hydride complexes.

4. The method of claim 2, wherein the iodine or hydroxyl end group on the PVDF-TrFE co-polymer is the hydroxyl end group, the hydroxyl end group is exchanged with the H end group, and exchanging the hydroxyl end group with the H end group comprises reacting a PVDF-TrFE co-polymer that has the hydroxyl end group with a source of hydrogen in a Barton-McCombie deoxygenation or reduction.

5. The method of claim 4, wherein the Barton-McCombie deoxygenation or reduction comprises converting the hydroxyl end group into a thiocarbonate or a xanthate end group, and subsequently treating the thiocarbonate or the xanthate end group with the hydrogen source and a radical source to provide the H end group.

6. The method of claim 2, wherein the iodine or hydroxyl end group on the PVDF-TrFE co-polymer is the hydroxyl end group, and exchanging the hydroxyl end group on the PVDF-TrFE co-polymer with the H, F or Cl end group comprises exchanging the hydroxyl end group on the PVDF-TrFE co-polymer with the F end group by reacting the PVDF-TrFE co-polymer having the hydroxyl end group with a fluoride ion source comprising (i) an ammonium fluoride or (ii) an alkali metal fluoride and an HF-pyridine solution.

7. The method of claim 2, wherein exchanging the iodine or hydroxyl end group on the PVDF-TrFE co-polymer with the H, F or Cl end group comprises exchanging the hydroxyl end group on the PVDF-TrFE co-polymer with the Cl end group by reacting the PVDF-TrFE co-polymer having the hydroxyl end group with a phosphorous chloride.

8. The method of claim 2, further comprising purifying the PVDF-TrFE co-polymer having the H end group by trituration with a nonpolar solvent and filtration.

9. The method of claim 1, wherein the PVDF-TrFE co-polymer is a random PVDF-TrFE co-polymer comprising a plurality of vinylidene fluoride units and a plurality of trifluoroethylene units, having a molecular weight of from 200 kDa to less than 600 kDa.

10. The method of claim 9, wherein the random PVDF-TrFE co-polymer has a greater solubility than and ferroelectric properties similar to a PVDF-TrFE co-polymer having a molecular weight of 600 kDa or more and an end group or substituent chemically dissimilar from H, F and Cl.

11. The method of claim 1, wherein p and q are in a ratio of from 10:90 to 90:10.

12. The method of claim 1, wherein $X^1$ is R, H or Cl and $X^2$ is independently H or Cl.

13. The method of claim 12, wherein $X^1$ is R or H and $X^2$ is H.

14. The method of claim 13, wherein $X^1$ is a $C_{1-4}$ alkyl group that contains from 3 to 2n+1 fluorine atoms.

15. The method of claim 13, wherein each of $X^1$ and $X^2$ is H.

16. A method of forming an electronic device, comprising printing a PVDF-TrFE co-polymer on a substrate as a ferroelectric, electromechanical, piezoelectric or dielectric material in the electronic device, wherein the PVDF-TrFE co-polymer has an end group selected from H, F and Cl.

17. The method of claim 16, wherein the PVDF-TrFE co-polymer is a random PVDF-TrFE co-polymer comprising a plurality of vinylidene fluoride units and a plurality of trifluoroethylene units, having a molecular weight of from 200 kDa to less than 600 kDa.

18. The method of claim 16, wherein the PVDF-TrFE co-polymer has a formula $X^1-(C_2H_2F_2)_p-(C_2HF_3)_q-X^2$, where $X^1$ is R, H, F or Cl, R is a $C_n$-alkyl group that may contain from 1 to 2n+1 fluorine atoms, $X^2$ is independently H, F or Cl, n is an integer of 1 to 6, p and q are integers of 2 or more, and p+q>2000.

19. The method of claim 18, wherein the electronic device is a memory cell.

20. The method of claim 19, wherein the memory cell is formed using a coating method.

* * * * *